United States Patent
Walczyk et al.

(10) Patent No.: US 11,639,556 B2
(45) Date of Patent: May 2, 2023

(54) MASSIVELY-PARALLEL MICRONOZZLE ARRAY FOR DIRECT WRITE ELECTRODEPOSITION OF HIGH-DENSITY MICROSTRUCTURE ARRAYS

(71) Applicant: Intel Corporation, Santa Clara, CA (US)

(72) Inventors: Joe Walczyk, Tigard, OR (US); Pooya Tadayon, Portland, OR (US); Andrew Hoitink, Beaverton, OR (US); Tanner Schulz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 879 days.

(21) Appl. No.: 15/857,362

(22) Filed: Dec. 28, 2017

(65) Prior Publication Data

US 2019/0203370 A1  Jul. 4, 2019

(51) Int. Cl.
*C25D 17/00* (2006.01)
*C25D 5/02* (2006.01)
*H05K 13/00* (2006.01)
*H05K 3/18* (2006.01)
*C25D 1/00* (2006.01)

(52) U.S. Cl.
CPC ............ *C25D 5/026* (2013.01); *C25D 1/003* (2013.01); *C25D 17/00* (2013.01); *H05K 3/188* (2013.01); *H05K 13/0015* (2013.01)

(58) Field of Classification Search
None
See application file for complete search history.

(56) References Cited

U.S. PATENT DOCUMENTS

| | | | |
|---|---|---|---|
| 6,290,331 B1* | 9/2001 | Agarwal | B41J 2/14016 347/45 |
| 2005/0051437 A1* | 3/2005 | Kurashina | C25D 17/002 205/143 |
| 2007/0089993 A1* | 4/2007 | Schwartz | C25D 5/08 205/133 |
| 2009/0026068 A1* | 1/2009 | Hongo | H01L 21/67046 204/199 |
| 2011/0120872 A1* | 5/2011 | Oda | C25D 1/02 428/34.1 |
| 2014/0231266 A1* | 8/2014 | Sherrer | B29C 70/882 164/94 |
| 2014/0345521 A1* | 11/2014 | Silverbrook | B29C 64/112 118/620 |

(Continued)

OTHER PUBLICATIONS

Chen et al., "A low cost desktop electrochemical metal 3d printer", Advanced Materials Technologies, Aug. 2017. (Year: 2017).*

(Continued)

*Primary Examiner* — Stefanie S Wittenberg
(74) *Attorney, Agent, or Firm* — Essential Patents Group, LLP.

(57) ABSTRACT

A micronozzle assembly, comprising a reservoir, an array of structures comprising micronozzles, a porous structure positioned between the reservoir and the array, and an electrode within the reservoir, wherein the electrode comprises any of a mesh, a frame along the perimeter of the cavity of the reservoir, or a rod extending into a cavity of the reservoir.

18 Claims, 7 Drawing Sheets

(56) References Cited

U.S. PATENT DOCUMENTS

2016/0297145 A1* 10/2016 Kanda .................. B29C 64/112

OTHER PUBLICATIONS

Hansen et al., "High-throughputprinting via microvascular multinozzle arrays", Advanced Materials, 2013, 25, 96-102. (Year: 2013).*
Chen et al., "A low cost desktop electrochemical metal 3d printer", Adv. Mater. Tech. Communication, 2017. (Year: 2017).*
Hu, et al., "Meniscus-Confined Three-Dimensional Electrodeposition for Direct Writing of Wire Bonds", Science vol. 329, 10 pages (2010).

* cited by examiner

MASSIVELY-PARALLEL MICRONOZZLE ARRAY FOR DIRECT WRITE ELECTRODEPOSITION OF HIGH-DENSITY MICROSTRUCTURE ARRAYS

BACKGROUND

The continuing trend in microelectronics packaging architecture for dimension reduction is pushing for higher density solder pad and bump arrays, where pad and bump pitches on dies and substrates fall well below 100 microns, with the current aim at sub-30 micron array pitch. Conventional methods for fabricating bump and pad arrays rely on lithographic techniques that add to package manufacture costs. Non-lithographic methods for producing high density bump and pad arrays are potentially lower cost routes, and can potentially contribute to significant manufacturing cost reductions in IC package manufacture.

In addition, inexpensive high-density test probe arrays are needed for end-of-line quality control of integrated circuits (IC) and package substrates. Conventional methods for test probe array manufacture are rapidly reaching practical limitations as mechanical placement and attachment of individual probe wires becomes increasingly difficult as probe pitch shrinks. Furthermore; traditional lithographic techniques are limited by feature aspect ratio (e.g., width and height), where applications such as high-density test probe arrays significantly benefit from feature aspect ratios beyond lithographic techniques.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
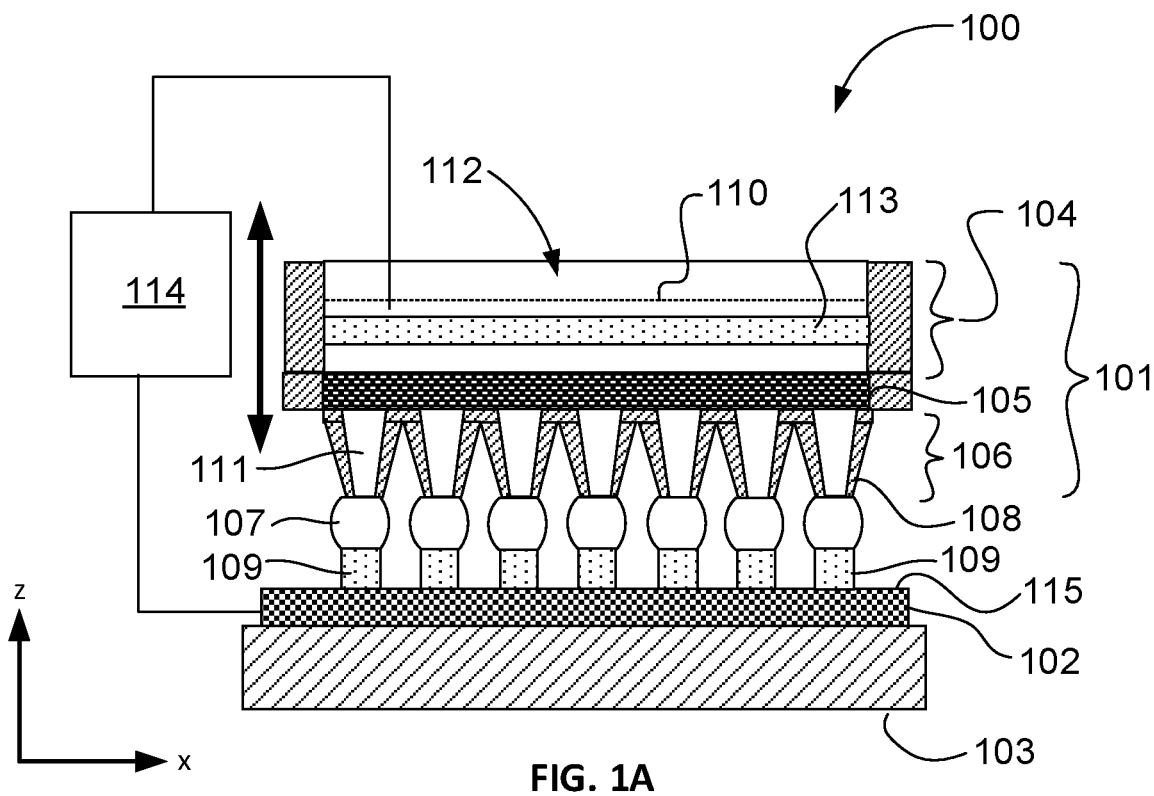
FIG. 1A illustrates a cross sectional view of a massively-parallel microplating tool, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "dielectric" generally refers to any number of non-conductive materials that make up the structure of a package substrate. For purposes of this disclosure, dielectric material may be incorporated into an IC package as layers of laminate film or as a resin molded over IC dies mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in microelectronic packages and dies. The term "solder pad" may be occasionally substituted for "bond pad", and carries the same meaning.

Here, the term "solder bump" generally refers to a solder layer formed on a bond pad. The solder layer typically has a round shape, hence the term "solder bump".

Here, the term "probe" generally refers to an interconnect between the Device Under Test (DUT) and Test Instrument, such as wire or elongated tip or lead. Most simply, a probe is contacted to a point in a circuit, typically for measurement of voltages at circuit points of a device under test (DUT). If two or more probes are used in concert, currents and voltages may be measured at the same time. In the context of this disclosure, a probe is a part of a probe array, where multiple probe wires are arranged in an array carried on a carrier substrate referred to as a "card". The probe array is arranged to contact partial or entire arrays of solder bumps or bond pads on integrated circuit (IC) die or package substrate DUTs. Thus, the spacing or pitch between probes must be commensurate with the bump or pad pitch on the DUT. Each probe in a probe array is individually addressable.

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "high density" generally refers to metallization structure arrays having center-to-center pitches below 100 microns (e.g., greater than 100 structures per $mm^2$) in one or both dimensions. Metallization structure arrays include bond pad arrays, solder bump arrays on package substrates and dies. However, the definition is extended to include probe arrays. Current industry trends target center-to-center pitches of 30 microns and below (e.g., greater than 1000 structures per $mm^2$). The small array pitch dimensions allow development of bond pad or solder bump arrays having tens of thousands of individual pads or bumps.

Here, the term "massively parallel" generally refers to simultaneously electroplating a very large array of metal microstructures through the micronozzle array comprising more than 10,000 microstructures. As there may be generally a one-to-one correspondence between the number of micronozzles and the number of plated microstructures, the micronozzle arrays described herein may be characterized as massively parallel, also comprising more than 10,000 micronozzles in one array.

Here, the term "direct write" generally refers to electroplating of microstructures through one or more micronozzles without reliance on lithography to define the plated structures.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Here, the term "micronozzle" generally refers to an orifice for the issuance of fluids, where the orifice has dimensions under 100 microns. For the purposes of this disclosure, micronozzle orifices are generally less than 30 microns in diameter. The orifice of the micronozzle may be surrounded by a nozzle body. An array of micronozzles comprises generally ordered arrays of micronozzles, each micronozzle comprising an orifice.

Disclosed herein is a massively parallel direct write microplating tool and method for producing high-density metallization structures on package substrates or IC dies (comprising 10,000 or more structures) by direct write microelectroplating techniques. A central aspect of the disclosed tool comprises a large array of micronozzles integrated onto a single fluid distribution plate. The micronozzle array comprises individual micronozzles that may number 10,000 or greater. During operation of the disclosed tool, these micronozzles concertedly dispense streams of electrolyte over a conductive surface or metallization pads of a substrate for the purpose of simultaneously electroplating metal microstructures on the substrate. Electrolyte issues from the orifices of the micronozzles at very low flow rates, where menisci (more than on meniscus) are maintained between the growing microstructures and the tips of each of the micronozzles, where there is a single microstructure formed below each micronozzle.

For the operation of the disclosed massively parallel direct write microelectrodeposition tool, the substrate is brought within close vicinity of the micronozzles and electrolyte is dispensed to form a meniscus between each individual micronozzle and the substrate surface. The diameter of the meniscus formed between each micronozzle and a growing microstructure determines the diameter of the plated microstructures, and the micronozzle array pitch determines the array pitch of the microstructure array. Using the disclosed tool, high-density arrays of high-aspect ratio microstructures may be formed in a massively parallel manner, without relying on lithographic methods. In some embodiments, arbitrary array configurations may be achieved.

In embodiments of this disclosure, the massively parallel microelectrodeposition tool comprises a micronozzle assembly that comprises a micronozzle array, a fluid reservoir. In some embodiments, electrolyte flow from the fluid reservoir and through the micronozzles to form menisci between the micronozzle tips and growing electroplated microstructures. According to some embodiments, the fluid reservoir is integrated with the micronozzle array, where the micronozzles are at the bottom of the fluid reservoir (plane of the fluid reservoir bottom in the x-y plane, the plane of the micronozzle array in coincident x-y plane), In some embodiments, a fluid distribution plate intervenes between the reservoir and the micronozzle array. The micronozzle array may be integrated onto the fluid distribution plate from the side opposite the reservoir. In some embodiments, the fluid distribution plate is a microfabricated structure integrated with the micronozzle array, and comprises engineered straight apertures (through-holes) extending through a plate structure separating the reservoir from the micronozzles. In some embodiments, the fluid distribution plate comprises a natural porous material, such as a ceramic membrane, integrated with the micronozzle array and the fluid reservoir into a unitary structure.

In some embodiments, an electrode is contained within the reservoir section of the electroplating head. The electrode may be an integral structure rimming the edge of the reservoir. In other embodiments, the electrode is a metal sheet or foil assembled into the electroplating head. In some embodiments, the electrode is inserted into the reservoir section manually. In operation of the disclosed tool, the electrode is coupled to a first terminal of a power source to provide a plating potential, where the substrate surface is coupled to a second terminal of the power source. In some embodiments, the second terminal of the power source, and the substrate, are at ground potential.

In some embodiments, the reservoir is a stand-alone vessel separated from the electroplating head. A section of tubing may be used to transfer electrolyte from the stand-alone vessel to the fluid distribution plate. A transfer pump may be used, which pressurizes the electrolyte and forces it into the micronozzle array. The pressure of the pump may be adjusted to create a meniscus between the individual micronozzles of the micronozzle array and the substrate surface. The porosity of the fluid distribution plate may be engineered or adjusted to provide a back pressure, permitting a small flow rate to be produced by relatively large pressures. In this manner, the flow can be controlled down to the microliter per minute range substantially uniformly through the entire micronozzle array.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1A illustrates a cross sectional view of massively-parallel microplating tool 100, according to some embodiments of the disclosure.

In FIG. 1A, massively-parallel microplating tool 100 is shown in an implementation embodiment comprising micronozzle assembly 101, substrate 102 mounted on actuator stage 103. Micronozzle assembly 101 comprises fluid reservoir vessel 104, fluid distribution plate 105 and micronozzle array 106. In the illustrated embodiment, micronozzle array 106 is in proximity of substrate 102. Liquid menisci 107 are at the interface between the base of individual micronozzles 108 and microstructures 109. In the illustrated embodiment, liquid menisci 107 are contiguous with liquid electrolyte 110 contained within fluid reservoir vessel 104. Liquid electrolyte 110 extends through fluid distribution plate 105 and through orifices 111 of individual micronozzles 108 to menisci 107.

In some embodiments, fluid reservoir 104 is a closed chamber that is pressurized (shown below). In some embodiments, pressurization may be achieved by a head of pressurized gas over electrolyte 110. In some embodiments, pressurization may be achieved by hydraulic pressure. In some embodiments, fluid reservoir 104 is coupled to an external supply of electrolyte. In some embodiments, fluid reservoir is coupled to an external supply of electrolyte through a pump (not shown).

In some embodiments, fluid reservoir vessel 104 comprises electrolyte chamber 112 and electrode 113. In some embodiments, counter electrode 113 is integrated on the walls of fluid reservoir vessel 104. In some embodiments, counter electrode 113 is a separate component assembled into electrolyte chamber 112. Counter electrode 113 is electrically coupled to power supply 114. Substrate 102 is electrically coupled to power supply 114. In some embodiments, substrate 102 comprises conductive surface 115 that is electrically coupled to power supply 114. Metal microstructures 109 extend from conductive surface 115. In some embodiments, an electric circuit is completed though metal microstructures 109, menisci 107, liquid electrolyte 110 and power source 114. In some embodiments, a potential difference is imposed between conductive surface 115 and counter electrode 110 by power source 114. In some embodiments, conductive surface 115 is a working electrode (e.g., cathode) for electroplating structures such as metal microstructures 109, and counter electrode 113 serves as an anode$_{[41]}$.

In some embodiments, actuator stage 103 carries substrate 102. In some embodiments, actuator stage 103 moves substrate 102 relative to micronozzle array 106 in at least two lateral dimensions (e.g., x and y). In some embodiments, actuator stage 103 moves substrate 102 relative to micronozzle array 106 in the z-direction, orthogonal to the x-y plane. In some embodiments, micronozzle assembly 101 including micronozzle array 106 is moved in the x, y and/or z-direction relative to substrate 102 by a separate actuator (not shown).

Figure 1B:
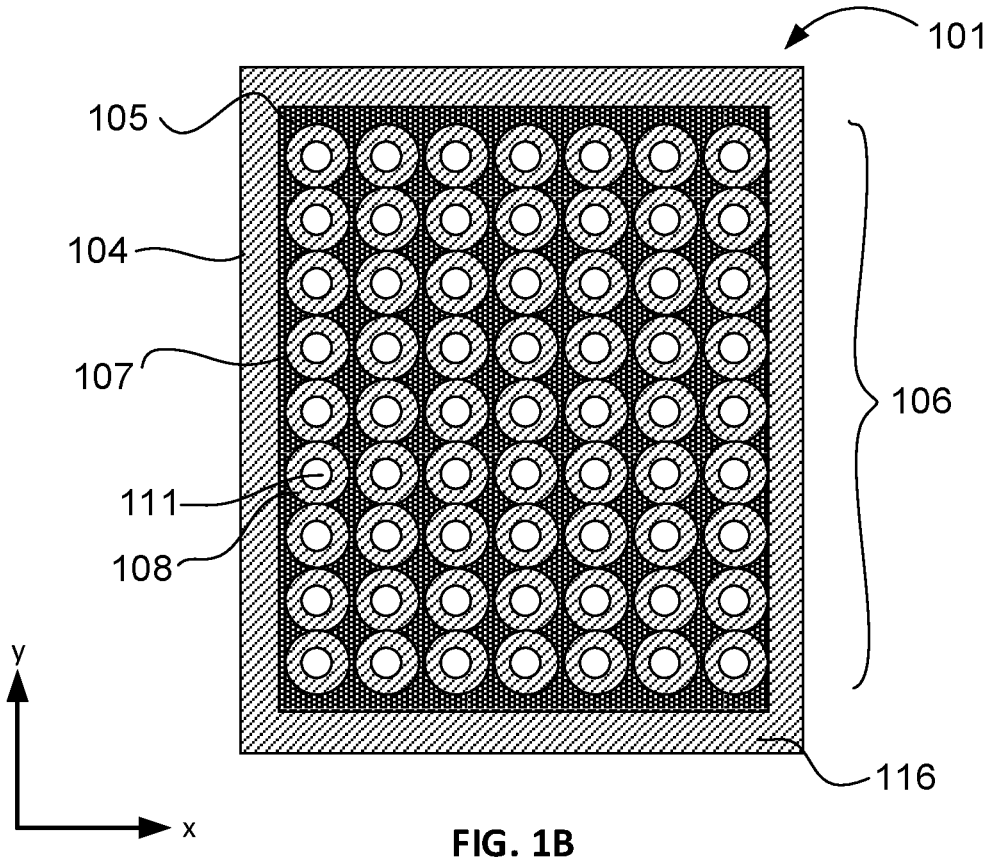
FIG. 1B illustrates a plan view of a massively parallel micronozzle assembly, according to some embodiments of the disclosure.

FIG. 1B illustrates a plan view of the micronozzle array 106 of massively parallel micronozzle assembly 101, according to some embodiments of the disclosure.

In FIG. 1B, micronozzle assembly 101 is viewed from the bottom side, Micronozzle array 106 is viewed from below, looking into orifices 111 of individual micronozzles 108. In the plan view of FIG. 1B, fluid distribution plate 105 is shown between individual micronozzles 108. Base plane 116 of micronozzle array 106 is cut away to expose fluid distribution plate 106. As will be shown below fluid distribution plate 105 is covered by impervious material in base plane 116 between micronozzles 108. In FIG. 1B, fluid distribution plate 105 is exposed to show its dimensional extents in the illustrated embodiment, with respect to fluid reservoir 104. It is understood that fluid distribution plate 105 is covered by impervious material so that electrolyte (e.g., 110 in FIG. 1A), is forced to flow only through orifices 111 in implementations, according to some embodiments.

Figure 2A:
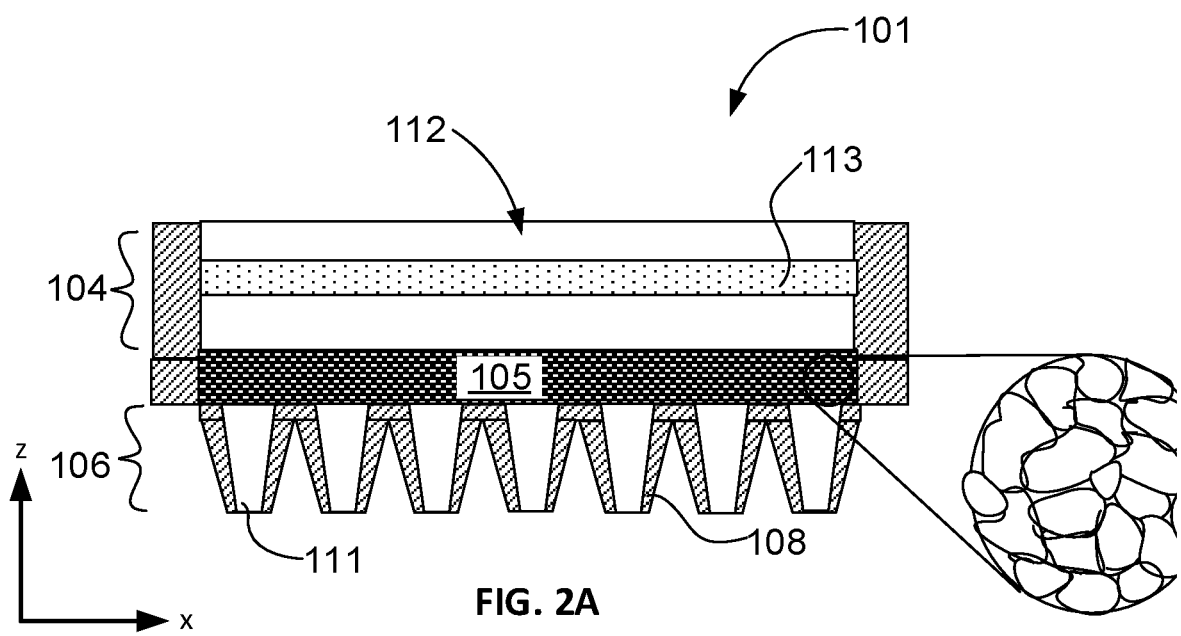
FIG. 2A illustrates a cross-sectional view of a first embodiment of a micronozzle assembly, according to some embodiments of the disclosure.

FIG. 2A illustrates a cross-sectional view of a first embodiment of micronozzle assembly 101, according to some embodiments of the disclosure.

In FIG. 2A, micronozzle assembly 101 comprises fluid distribution plate 105 intervening between fluid reservoir 104 and micronozzle array 106. In some embodiments, micronozzles 108 comprise a conical tip, as shown in the illustrated embodiment. In some embodiments, micronozzles 108 comprise a cylindrical tip. In some embodiments, fluid distribution plate 105 is a porous membrane. In some embodiments, fluid distribution plate 105 is a ceramic membrane. Ceramic materials may have a natural tortuous porosity, as shown magnified in the inset of FIG. 2A. Porosity of a ceramic membrane may be engineered by known materials formulations. Ceramic materials suitable for fluid distribution plate 105 include, but are not limited to, oxides of aluminum (e.g., beta or alpha alumina), anodized aluminum, titanium, silicon, zirconium (e.g., zircon). In some embodiments, fluid distribution plate 105 comprises an organic porous material. In some embodiments, fluid distribution plate is an organic membrane. Organic materials include, but are not limited to, cellulose acetate, mixed cellulose ester, polycarbonate, polyether ether ketone (PEEK), polyethersulfone (PES), polyester, polypropylene, polytetrafluoroethylene (PTFE), and polyvinylidene difluoride (PVDF).

In some embodiments, fluid distribution plate is assembled into the body of micronozzle assembly 101. In some embodiments, micronozzle assembly 101 comprises modular parts, such as fluid distribution plate 105, fluid reservoir 104 and micronozzle array 106. In some embodiments, fluid distribution plate 105 is replaceable and interchangeable, as described below. In some embodiments, fluid reservoir 104 comprises a cavity, such as electrolyte chamber 112, surrounded by a wall. In some embodiments, electrolyte chamber 112 is over fluid distribution plate 105. In some embodiments, fluid distribution plate 105 is the bottom of fluid reservoir 104. In some embodiments, the pores of fluid distribution plate are fluidically coupled to electrolyte chamber 112 and orifices 111 of micronozzles 108. In some embodiments, fluid distribution plate 105 regulates electrolyte flow between fluid reservoir 104 and micronozzle array 106. In some embodiments, micronozzle array 106 comprises more than 10,000 to over 1,000,000 individual micronozzles 108 arranged in close-packed hexagonal geometries, or other array geometries, such as square unit cell geometries. Center-to-center pitch may be adjusted to suit a particular architecture. In some embodiments, center-to-center pitch of micronozzle array 106 is 100 microns or less. In some embodiments, center-to-center pitch of micronozzle array 106 is 30 microns or less.

In a first example, a 3 mm×3 mm square micronozzle array having a center-to-center pitch of 20 microns comprises approximately 22,500 micronozzles in a close-packed array. In a second example, a 25 mm×25 mm square micronozzle array having a center-to-center pitch of 20 microns comprises approximately 1,500,000 micronozzles in a close packed array. Micronozzle array 106 comprising over 10,000 micronozzles 108 facilitate massively parallel "direct write" precision electroplating of metal microstructures on a substrate (described below). Diameters of orifices 111 may be adjusted to restrict flow rate of electrolyte exiting micronozzles 108 during the electroplating process (described below).

In some embodiments, micronozzle assembly 101 may be fabricated as separate modular pieces. In some embodiments, parts of micronozzle assembly 101, such as micronozzle array 106 and fluid reservoir 104, are microfabricated by lithographic methods. As an example, photoreactive epoxy resins forming thick coatings, such as SU-8 negative tone thick layer photoresist (thicknesses ranging to over 500 microns), may be patterned to form three-dimensional (3D) structures, such as micronozzles 108, in large arrays with micron-precision micrometric dimensions and resolution.

One exemplary technique that may be employed to form conical micronozzles in large arrays is to rotate a substrate coated with a thick photoresist and tilted with respect to the plane of a photomask. The photomask may be patterned with point apertures. Due to the rotation of the tilted substrate. During the exposure steps, rays of light emanating from the point apertures in the photomask impinge on the photoresist layer and trace circular paths, where the light penetrates the photoresist layer at an angle. The angle of penetration defines the angle of conicity of micronozzles 108, as the rotation of the tilted substrate causes the rays of light to expose multiple conical swaths of the photoresist, defining conical micronozzles 108. Exposed regions of a negative tone photoresist are removed upon development.

Multiple photomask exposures may be employed to further pattern the thick photoresist. As an example, orifices 111 that are substantially perpendicular to the plane of the substrate may be formed by standard lithographic methods, for example, by maintaining the substrate stationary and parallel to the photomask during exposure.

In some embodiments, micronozzle assembly 101 is formed as a build-up of multiple photoresist layers. In some embodiments, micronozzle array 106 is a first photoresist layer of micronozzle assembly 101. In some embodiments, micronozzle array is integrated on a first side of fluid distribution plate 105, employed as a substrate. In some embodiments, fluid distribution plate is a ceramic membrane. In some embodiments, fluid reservoir 104 is a second photoresist layer of micronozzle assembly 101. In some embodiments, fluid reservoir 104 is integrated on the second side of fluid distribution plate 105. In some embodiments, micronozzle assembly is a unitary integrated structure, comprising micronozzle array 101, integrated on the first side of fluid distribution plate 105, and fluid reservoir 104, integrated on the second side of fluid distribution plate 105. Fluid reservoir 104 is fluidically coupled to micronozzle array 106 through fluid distribution plate 105, according to some embodiments.

In some embodiments, micronozzle array 106 and fluid reservoir 105 are separate parts of micronozzle assembly 101. After fabrication, micronozzle array 106, fluid reservoir 105 and fluid distribution plate 105 are assembled, according to some embodiments.

In some embodiments, parts of micronozzle assembly 101 are formed by three-dimensional (3D) printing techniques. The level of precision achievable with 3D printing methods is similar to that achieved by lithographic methods, such as the method described above. Polymeric materials may be employed in 3D printing of parts of micronozzle assembly 101. In some embodiments, thermoplasitic materials such as, but not limited to, polycarbonate, polyamides (e.g., Nylon), epoxy resins, acrylonitrile butadiene styrene (e.g., ABS). polyphenylsulfones, polyetherimides (e.g., Ultem) and polylactic acid (PLA).

In some embodiments, micronozzle assembly 101 may be formed by injection molding methods. Polymeric materials may be employed for injection molding, such as, but not limited to, polycarbonate, polyether ether ketone (PEEK), polyamides (e.g., Nylon), epoxy resins, polyethersulfone (e.g., PES), polyesters, polypropylene, polytetrafluoroethylene (PTFE), fluorinated ethylene propylene (FEP), and polyvinylidene difluoride (PVDF).

With massively parallel micronozzle arrays 106, the total cross-sectional area of orifices 111 may be large enough to present a low flow resistance. Orifice diameter may have a low limit of tens of microns. Fluid distribution plate 104 may have average pore sizes in the nanometer range. Additional tortuosity presents a larger flow resistance than may be attained relying on orifices 111 alone. In this manner, flow of electrolyte can be precisely controlled.

Figure 4A:
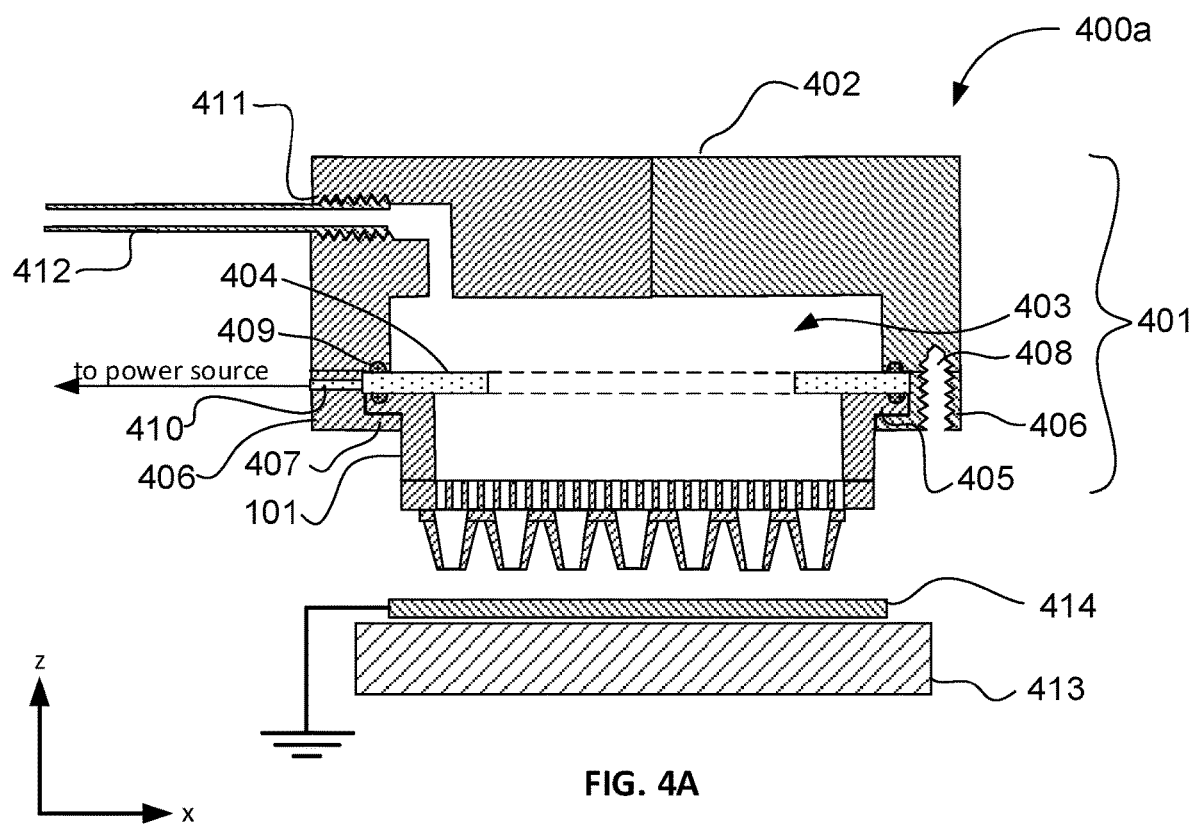
FIG. 4A illustrates a cross-sectional view of a first embodiment of the massively parallel microplating tool, according to some embodiments of the disclosure.
Figure 4B:
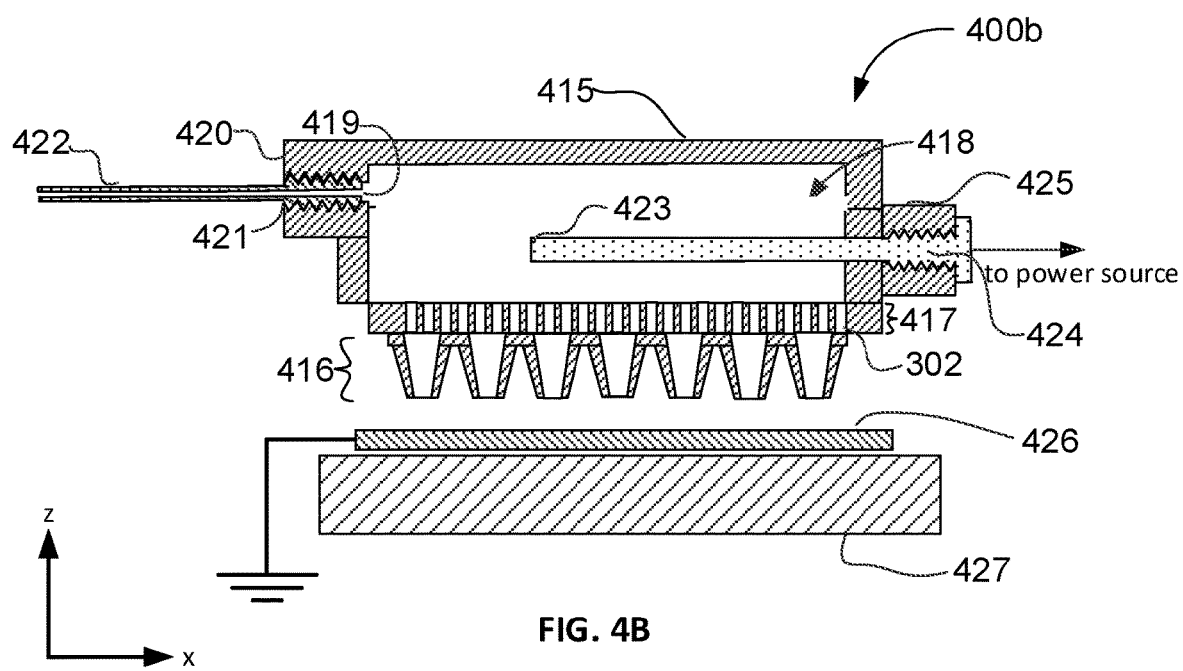
FIG. 4B illustrates a cross-sectional view of a second embodiment of the massively parallel microplating tool, according to some embodiments of the disclosure.

In some embodiments, fluid reservoir 104 is a closed vessel as described below (FIGS. 4A and 4B). In some implementation embodiments, electrolyte is pressurized. Pressurization methods are described below.

Figure 2B:
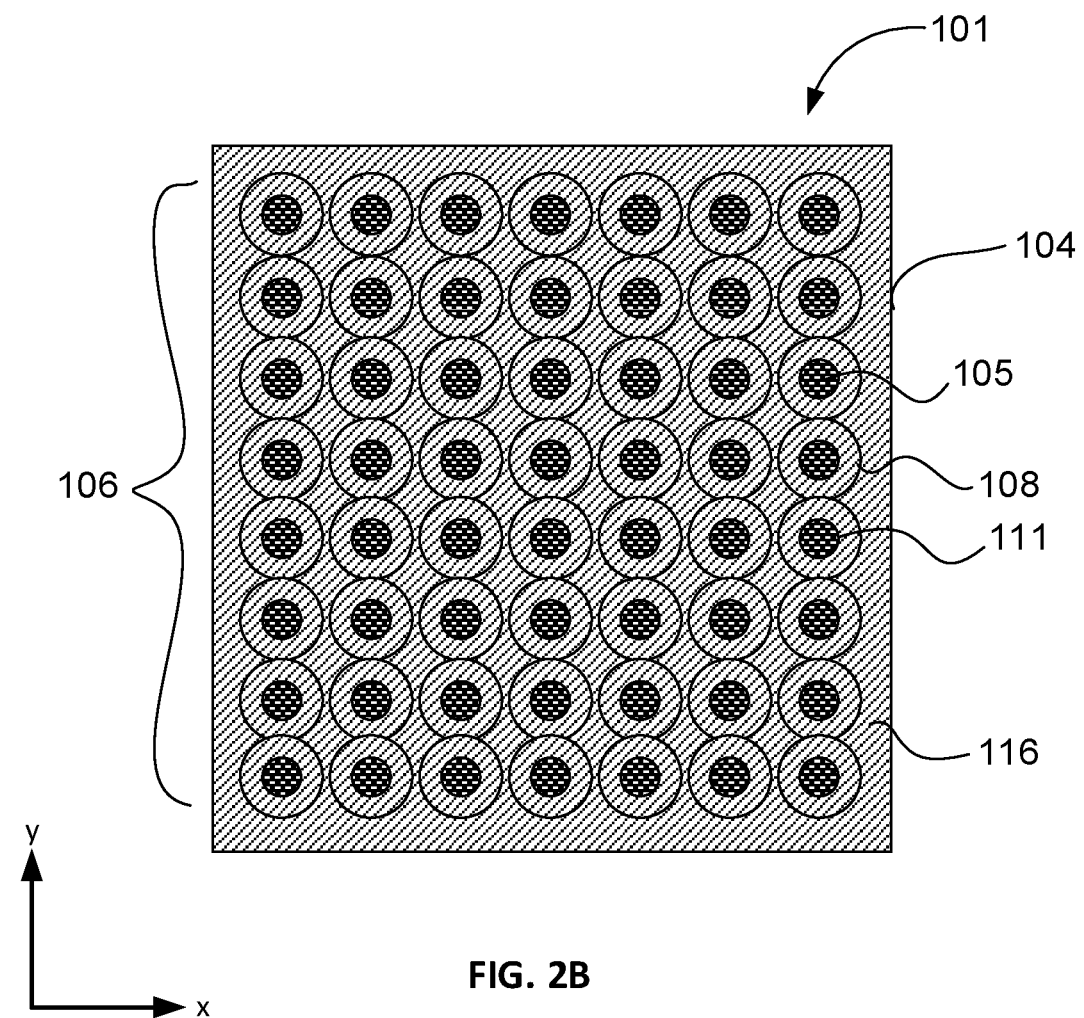
FIG. 2B illustrates a plan view of the first embodiment of the micronozzle assembly, according to some embodiments of the disclosure.

FIG. 2B illustrates a plan view of the first embodiment of micronozzle assembly 101, according to some embodiments of the disclosure.

In FIG. 2B, micronozzle array 106 is viewed from below. In the illustrated embodiment, micronozzle array 106 comprises a square array of micronozzles 108. In other embodiments, suitable array geometries may be employed. In some embodiments, micronozzles 108 are arranged in a close-packed hexagonal array. In some embodiments, micronozzle array 106 is separated into array blocks. In the plan view of FIG. 2B, fluid distribution plate 105 is visible as viewed through orifices 111. Fluid distribution plate 105 is disposed in a higher z-plane above base plane 116 of micronozzle array 106 (FIG. 2A). Fluid reservoir 104 lies above base plane 116 of micronozzle array-106.

Figure 3A:
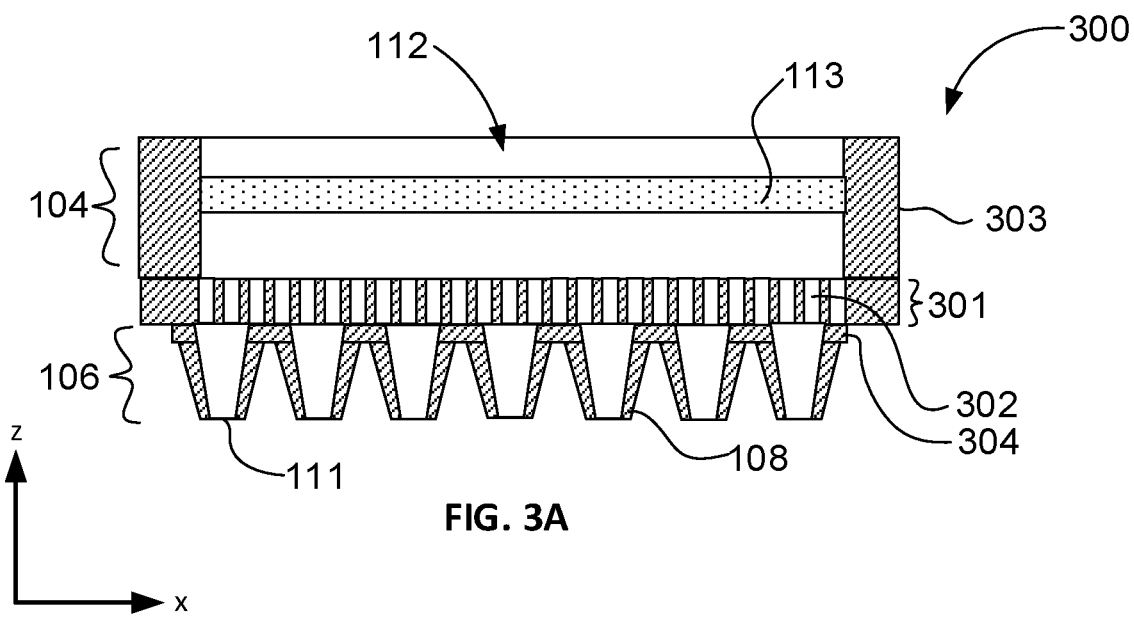
FIG. 3A illustrates a cross-sectional view of a second embodiment of a micronozzle assembly, according to some embodiments of the disclosure.

FIG. 3A illustrates a cross-sectional view of a second embodiment of micronozzle assembly 300, according to some embodiments of the disclosure.

In FIG. 3A, micronozzle assembly 300 comprises fluid distribution plate 301 intervening between fluid reservoir 104 and micronozzle array 106. In some embodiments, fluid distribution plate 301 is a microstructured membrane. In some embodiments, fluid distribution plate 301 is integral with base plane 304 of micronozzle array 106. Electrolyte chamber 112 is over fluid distribution plate 301. In some embodiments, fluid distribution plate 301 is integral with both fluid reservoir 104 and micronozzle array 106. In the illustrated embodiment, fluid distribution plate 301 comprises straight apertures 302 arranged in an ordered array. In some embodiments, straight apertures 302 are arranged randomly in an array. In some embodiments, apertures 302 are arranged in separate domains within fluid distribution plate 301. In some embodiments, fluid distribution plate is required structural support for fluid pressure arising from fluid reservoir 104. In some embodiments, straight apertures 302 are fluidically coupled to electrolyte chamber 112, and orifices 111 of micronozzles 108. Straight apertures 302 may be engineered to diameters of 1 to 10 microns.

In some embodiments, micronozzle assembly 300 is a unitary integrated structure. Fabrication techniques for forming micronozzle assembly 300 as a unitary integrated structure are described in detail above.

In some embodiments, counter electrode 113 is embedded into wall 303 of fluid reservoir 104 within electrolyte chamber 112. In some embodiments, counter electrode 113 is a separate component assembled into micronozzle assembly 300. In some embodiments, at least a portion of counter electrode 113 is exposed within electrolyte chamber 112. Details of incorporation of counter electrode 113 are described below.

Figure 3B:
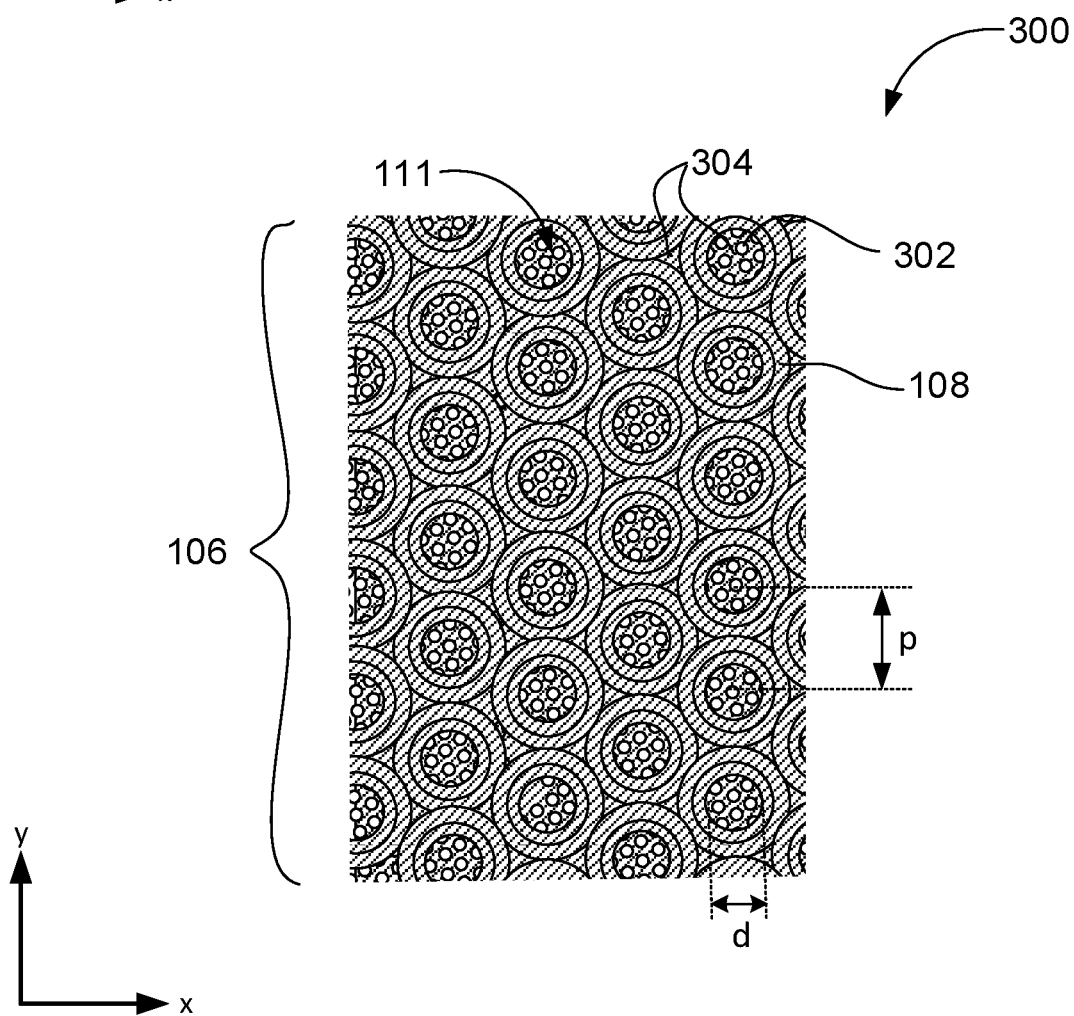
FIG. 3B illustrates a plan view of a second embodiment of the micronozzle assembly, according to some embodiments of the disclosure.

FIG. 3B illustrates a plan view of second embodiment of micronozzle assembly 300, according to some embodiments of the disclosure.

In FIG. 3B, a zoom view of micronozzle array 106 is shown looking into orifices 111 of individual micronozzles 108 to show details of base plane 304. Visible within orifices 111 are apertures 302; In the illustrated embodiment, apertures 302 are arranged in an ordered array. In some embodiments, apertures 302 are arranged in other geometries. As stated above, the size and pitch of individual micronozzles 108 and orifices 111 may be adjusted for the size (e.g., diameter) d and center-to-center pitch p of plated microstructures.

FIG. 4A illustrates a cross-sectional view of first embodiment of massively parallel microplating tool 400a, according to some embodiments of the disclosure.

In some embodiments, micronozzle assembly 101 comprises modular pieces that are bolted together by screw fasteners. In some embodiments, modular pieces may be clamped together. Gaskets or o-rings may by employed to seal against leaks. Parts may be produced by injection molding. In some embodiments, micronozzle assembly 101 comprises polymeric materials, including, but not limited to, moldable materials, such as polyesters, polycarbonates, acrylics, epoxy resins, polyether sulfone (PES), polyether ether ketone (PEEK), polytetrafluoroethylene (PTFE), and polyvinylidene difluoride (PVDF). In some embodiments, micronozzle array 106 and fluid reservoir 104 are lithographically-defined structures, comprising a photosensitive resin, such as, but not limited to, high-viscosity negative tone photoresist (e.g., SU-8).

In FIG. 4A, massively parallel microplating tool 400a comprises micronozzle unit 101 as part of micronozzle assembly 401. In the illustrated embodiment, micronozzle assembly 401 is comprises plating head 402, fluid reservoir 403 counter electrode 404 and micronozzle unit 101. In some embodiments, micronozzle unit 101 comprises flange 405 for attachment to plating head 402. In some embodiments, plating head base 406 comprises lip 407 that overlaps flange 405. In some embodiments, plating head base 406 is detachable from plating head for attachment and removal of micronozzle unit 101. In some embodiments, flange 405 and lip 407 comprises threaded holes 408 to accommodate fasteners such as bolts. In some embodiments, bolts are employed to fasten micronozzle unit 101 to plating head 402. In some embodiments, clamps are employed to fasten micronozzle unit 101 to plating head 402.

In some embodiments, plating head 402 and plating head base 406 comprise dielectric materials such as, but not limited to, polymers such as polyesters, polycarbonates, acrylics, epoxy resins, polyether sulfone (PES), polyether ether ketone (PEEK), polytetrafluoroethylene (PTFE), and polyvinylidene difluoride (PVDF). In some embodiments, dielectric materials comprise ceramics such as alumina, alumino-silicates, boron nitride, glass ceramics (e.g., Macor), magnesium oxide and zirconium phosphate.

In some embodiments, counter electrode 404 is seated between plating head 402 and micronozzle unit 101. Counter electrode 404 may be seated above micronozzle unit 101 during assembly of micronozzle assembly 401, and securely retained between micronozzle unit 101 and plating head 402. In some embodiments, gaskets 409 are seated between counter electrode 404 and plating head 402 and/or micronozzle unit 101. Gaskets 409 may provide a seal to prevent leakage of electrolyte through the seams between counter electrode 404 and plating head 402 and micronozzle unit 101. In some embodiments, counter electrode 404 is coupled to a power source (not shown) through stem 410. In some embodiments, counter electrode 404 comprises gold, platinum, palladium or copper. In some embodiments, counter electrode 404 comprises a rim portion that is seated between plating head 402 and micronozzle unit 101. The rim partially extends into fluid reservoir 403. In some embodiments, counter electrode 404 comprises a mesh (not shown) extending at least partially across fluid reservoir 403.

In some embodiments, fluid inlet port 411 extends through plating head 402, from the exterior wall to fluid reservoir 403. In the illustrated embodiment, fluid inlet port 411 is threaded for fastening tubing 412 to plating head 402. Tubing 412 is coupled to a pump or other pressurization mechanism, such as pressurized electrolyte from an external reservoir. In some embodiments, fluid inlet port 411 provides a port for flowing electrolyte into fluid reservoir 403.

In some embodiments, massively parallel microplating tool 400a comprises motion actuator 413 for moving substrate 414 in at least one dimension (e.g., x dimension) relative to micronozzle assembly 401. Substrate 414 is coupled to a first power source terminal (not shown). In some embodiments, substrate 414 is coupled to a second power source terminal, symbolized by the ground connection to substrate 414.

FIG. 4B illustrates a cross-sectional view of a second embodiment of massively parallel microplating tool 400b, according to some embodiments of the disclosure.

In FIG. 4B, massively parallel microplating tool 400b comprises micronozzle assembly 415. In some embodiments, micronozzle assembly 415 is a unitary body. In some embodiments, micronozzle assembly 415 comprises micronozzle array 416, fluid distribution plate 417 and fluid reservoir 418. In the illustrated embodiment, fluid distribution plate 417 comprises straight apertures 302. Fluid inlet port 419 extends from the exterior wall 420 of micronozzle assembly 415 to fluid reservoir 418. In some embodiments, fluid inlet port 419 is a threaded port to accept threaded tubing connector 421. In some embodiments, fluid inlet port 419 is a quick-disconnect receptacle.

Tubing 422 is a conduit line for introducing electrolyte into fluid reservoir 418. In some embodiments, tubing 422 is coupled to a pump, compressed gas source or a pressurized vessel containing electrolyte. Counter electrode 423 may be in the shape of a rod that extends through the wall of fluid reservoir 418. In the illustrated embodiment, counter electrode 423 comprises threaded portion 424 that mates with port 425. In some embodiments, two or more counter electrodes identical or similar to counter electrode 423 are employed. In some embodiments, the two or more counter electrodes are distributed around fluid reservoir 418 at regular intervals to spread the current distribution within the electrolyte contained with fluid reservoir 418 during operation. In some embodiments, counter electrode 423 is coupled to a first power source terminal (not shown). In some embodiments, counter electrode 423 is an anode$_{[A2]}$. In some embodiments, substrate 426 is coupled to a second power source terminal, symbolized by the ground connection to substrate 426.

In some embodiments, substrate 426 is mounted on actuator stage 427. for moving (displacing) substrate 426 in at least one dimension (e.g., x dimension) relative to micronozzle array 416. In some embodiments, actuator stage 427 displaces substrate 426 in the x, y and z dimensions.

FIGS. 5A-5D illustrate cross-sectional views of a method of operation of massively parallel microplating tool 500, for direct writing electroplating metal microstructures on a substrate, according to some embodiments of the disclosure.

Figure 5A:
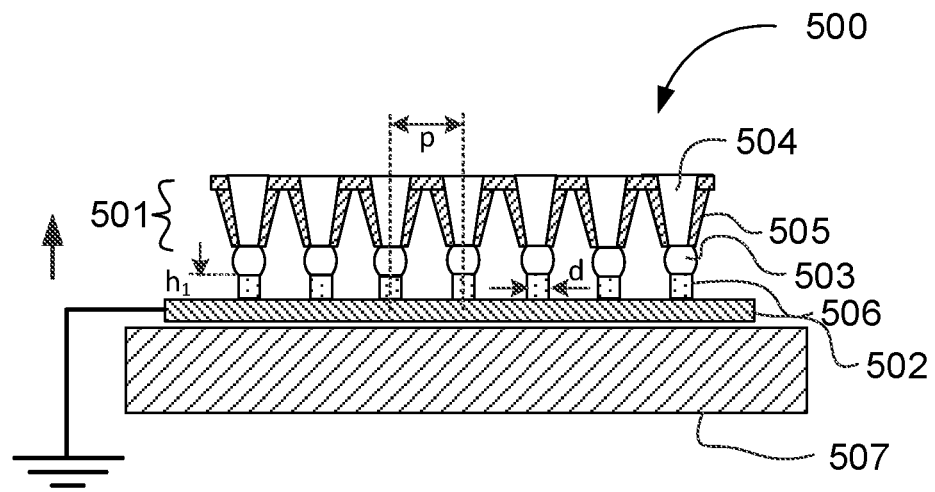
FIGS. 5A-5D illustrate cross-sectional views of a method of operation of a massively parallel microplating tool, for direct writing electroplating metal microstructures on a substrate, according to some embodiments of the disclosure. according to some embodiments of the disclosure.

In FIG. 5A, micronozzle array 501 is shown over substrate 502. Electrolyte menisci 503 issue from orifices 504 of micronozzles 505. Below electrolyte menisci 503 are metal microstructures 506. In some embodiments, metal microstructures 506 have a diameter d that is less than or equal to the diameter of orifices 504, and a pitch p that is substantially equal to the center-to-center pitch p of micronozzles 505. In some embodiments, orifice diameter d ranges from 5 microns to 100 microns. In some embodiments, center-to-center pitch p of micronozzle array 501 ranges from 10 microns to 100 microns.

Metal microstructures 506 may be plated to z-height $h_1$ by setting the plating conditions, which determine the plating rate. In some embodiments, plating rate is controlled by adjusting the electrolyte concentration and plating voltage (potential). Z-height $h_1$ is determined by plating rate and plating time. During plating, electrolyte menisci 503 are maintained by metering electrolyte through orifices 504 of micronozzles 505. As metal microstructures 506 grow in the z-direction, the z-distance between substrate 502 and micronozzle array 501 is gradually increased to maintain the z-height of menisci 503. In some embodiments, actuator stage 507 displaces substrate 502 in the z-direction (indicated by the large up-pointing arrow on the left of FIG. 5A). In some embodiments, micronozzle array 501 is displaced independently. In some embodiments, actuator stage 507 displaces substrate 502 laterally (x and/or y dimensions) during the direct write process. With simultaneous lateral displacement, lines, such as signal traces, may be formed.

Metal microstructures 506 comprise metals such as copper, gold or nickel. In some embodiments, substrate 502 is not displaced laterally (zero motion in the x and y dimensions) relative to micronozzle array 501. Metal microstructures 506 formed without lateral displacement of substrate 502 may be high-density arrays of bond pads, having a center-to-center pitch substantially equal to center-to-center pitch p of micronozzle array 501, ranging between 10 to 100 microns, according to some embodiments.

Bond pad diameters may range from 5 to 100 microns, corresponding to the diameter range of orifices 504. Massively parallel microplating tool 500 facilitates massively parallel direct writing of high-density bond pad arrays without any reliance on lithographic techniques. In some embodiments, high-density bond pad arrays formed by massively parallel microplating tool 500 comprise 10,000 bond pads to over 1,000,000 bond pads. As an example of a high-density array of bond pads formed by direct writing with massively parallel microplating tool 500, a center-to-center pitch p of 30 microns for 10-micron diameter bond pads results in an array comprising over 100,000 10-micron bond pads in a 1 cm$^2$ patch. In some embodiments, large scale arrays may be formed by direct writing or printing of array blocks, where micronozzle array 501 is displaced laterally by an entire length or width after each bond pad array is printed.

Figure 5B:
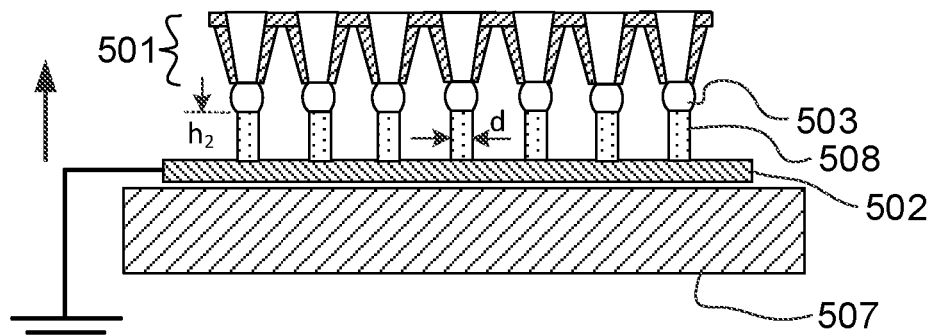

In FIG. 5B, metal microstructures 508 are plated to a z-height $h_2$ above the level of substrate 502. In some embodiments, the z-height of metal microstructures 507 is determined by duration of plating. Actuator stage 507 may displace substrate 502 in the z-dimension at a rate commensurate with growth of metal microstructures 508. In some embodiments, micronozzle array 501 is displaced in the z-dimension relative to substrate 502 by a separate actuator (not shown). The z-height $h_2$ of metal microstructures 508 may be pre-determined by adjusting plating time. In some embodiments, metal microstructures 508 have medium aspect ratios ($h_2/d$) between 1 and 10.

Maintenance of menisci dimensions permit diameter d of metal microstructures 508 to remain substantially constant during plating. In some embodiments, micronozzle array 501 is displaced in the z-dimension at the rate of growth of metal microstructures 508 to maintain the diameter of menisci 503. In some embodiments, menisci 503 are replenished by controlling the flow of electrolyte through orifices 504. In some embodiments, flow of electrolyte through micronozzles 505 is controlled by a precision syringe pump (not shown) coupled to a fluid reservoir (e.g., 415 in FIG. 4B) that is coupled to micronozzle array 501.

Figure 5C:
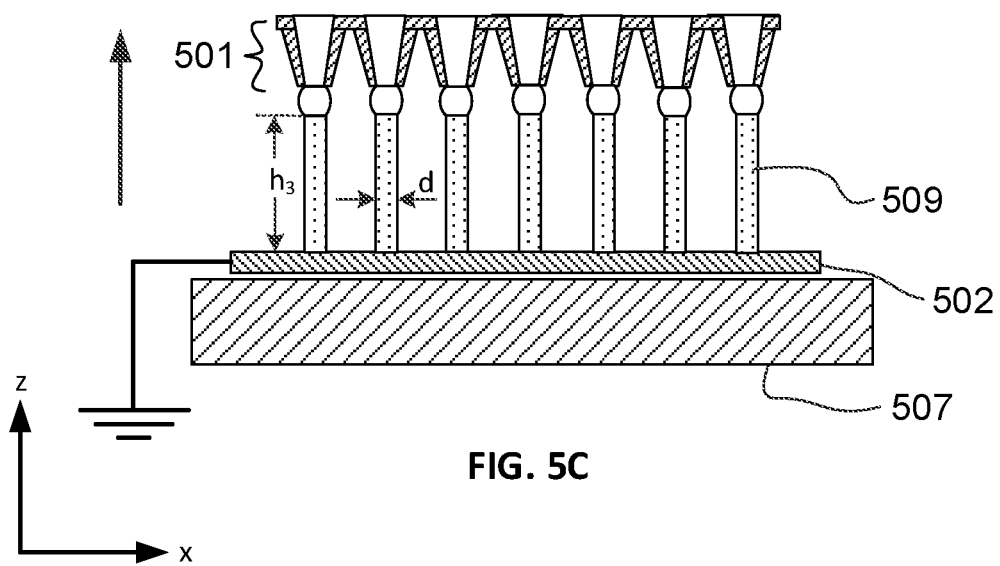

In FIG. 5C, metal microstructures 509 are plated to a z-height of $h_3$, above the level of substrate 502. Actuator stage 507 may displace substrate 502 in the z-dimension. In some embodiments, micronozzle array 501 is displaced in the z-dimension relative to substrate 502 by a separate actuator (not shown). In some embodiments, high-density arrays of high-aspect ratio metal microstructures 509 are formed. In some embodiments, metal microstructures 509 are high-aspect ratio probe wires formed by directly writing, having an aspect ratio $h_3/d$ ranging from approximately 10 to over 100. In some embodiments, $h_3$ is 500 microns or greater, with a diameter of 30 microns. Large-scale arrays of high aspect ratio microstructures such as wire probes may be produced by step-wise displacement of micronozzle array 501 after direct writing of each block of probes.

Figure 5D:
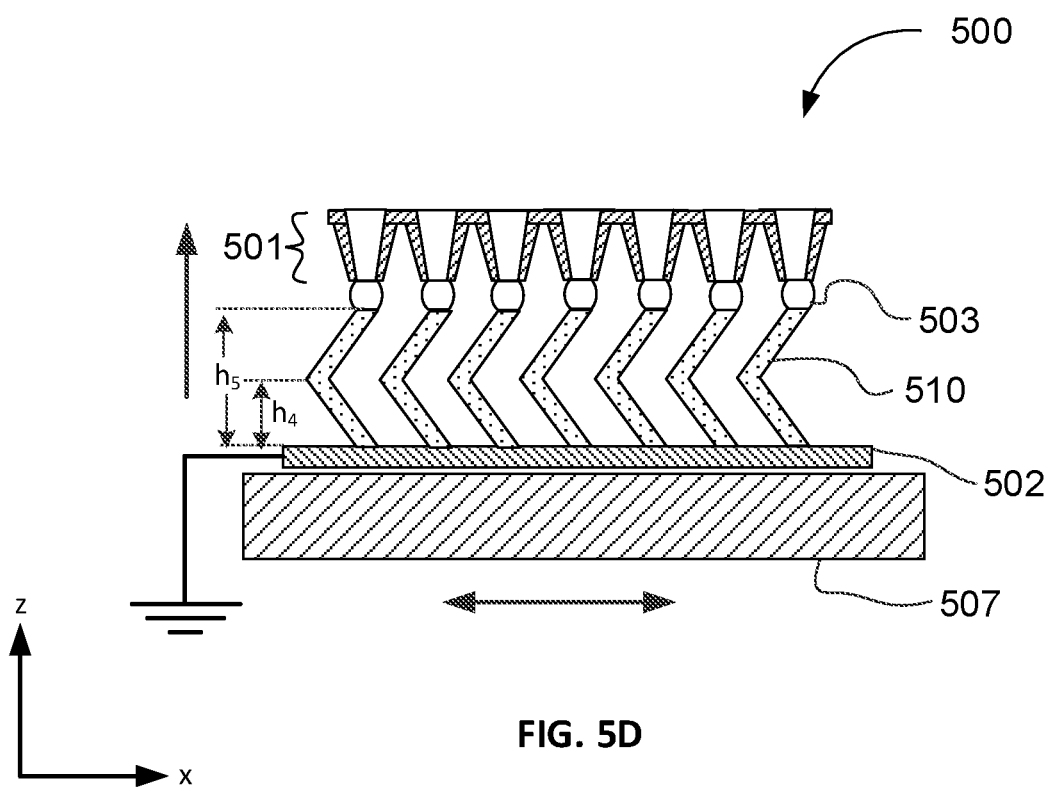

In FIG. 5D, metal microstructures 510 are plated as chevron-shaped structures having a z-height of $h_5$. In some embodiments, the chevron shape is achieved by lateral displacement of substrate 502 relative to micronozzle array 501 in the x-dimension or the y-dimension. In some embodiments, the lateral displacement occurring at the same time as the vertical growth forms an inclined wire. Gradually displacing growing microstructures 510 tilts menisci 503, allowing growing layers of metal to form offset layers, producing ledges overhanging the layer below. The side where the ledge is formed is in the direction of the lateral displacement. Incremental lateral movement of actuator 507 in the displacement direction produces a series of offset layers, forming an array of inclined wires.

In some embodiments, formation of chevron-shaped metal microstructures 510 is achieved by growth of inclined wires to a z-height of $h_4$, then reversing lateral direction of actuator 507 to continue plating until the z-height of $h_5$ is reached.

Figure 5E:
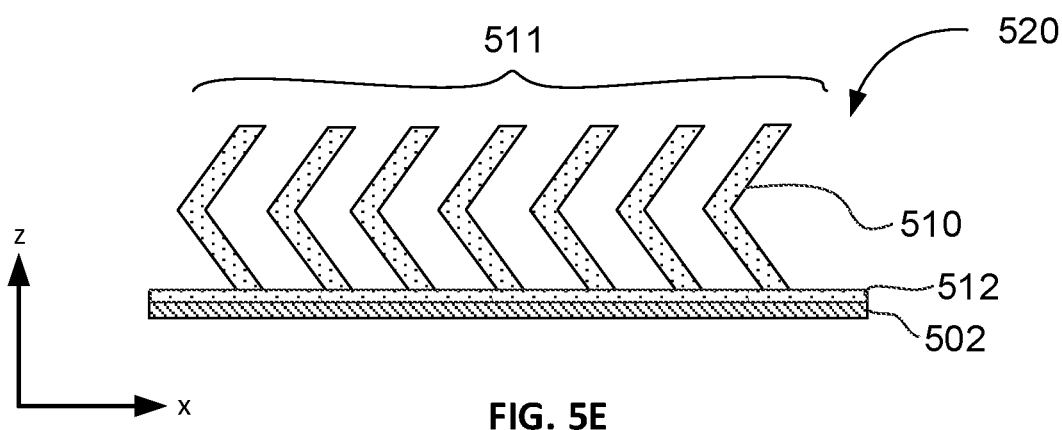
FIG. 5E illustrates a cross-sectional view of an exemplary probe card comprising a chevron-shaped probe wire array formed by the described method, according to embodiments of the disclosure.

FIG. 5E illustrates a cross-sectional view of exemplary probe assembly (probe card) 520 comprising a chevron-shaped probe wire array formed by the described method, according to embodiments of the disclosure.

In FIG. 5E, an example of a first embodiment of an array of high-aspect ratio metal microstructures (chevron-shaped probe wires) 510 is shown as probe card 520. In some embodiments, probe card 520 comprises probe wire array 511 on substrate 502. Probe wire array 511 comprises chevron-shaped probe wires 510 on substrate 502. In some embodiments, substrate 502 comprises conductive surface 512. In some embodiments, conductive surface 512 partially covers substrate 502. In some embodiments, chevron-shaped probe wires 510 are contiguous with conductive surface 512. Chevron-shaped probe wires 510 extend directly from conductive surface 512.

Figure 5F:
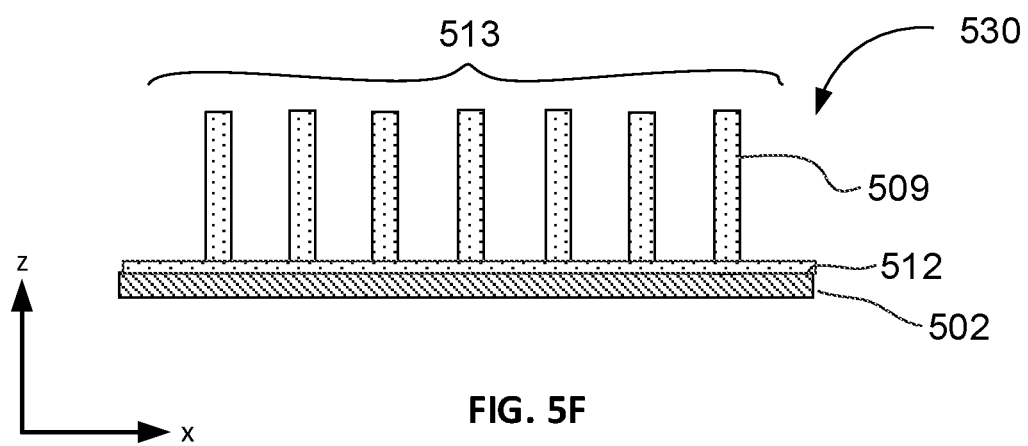
FIG. 5F illustrates a cross-sectional view of an exemplary probe card comprising a straight probe wire array formed by the described method, according to embodiments of the disclosure.

FIG. 5F illustrates a cross-sectional view of exemplary probe card 530 comprising a straight probe wire array formed by the described method, according to embodiments of the disclosure.

In FIG. 5F, an example of a second embodiment of an array of high-aspect ratio metal microstructures (straight probe wires) 509 is shown as probe card 530. In some embodiments, probe card 530 comprises probe wire array 513 on substrate 502. Probe wire array 513 comprises straight probe wires 509 on substrate 502. In some embodiments, substrate 502 comprises conductive surface 512. In some embodiments, conductive surface 512 partially covers substrate 502. In some embodiments, chevron-shaped probe wires 509 are contiguous with conductive surface 512. Straight probe wires 509 extend directly from conductive surface 512.

Figure 6:
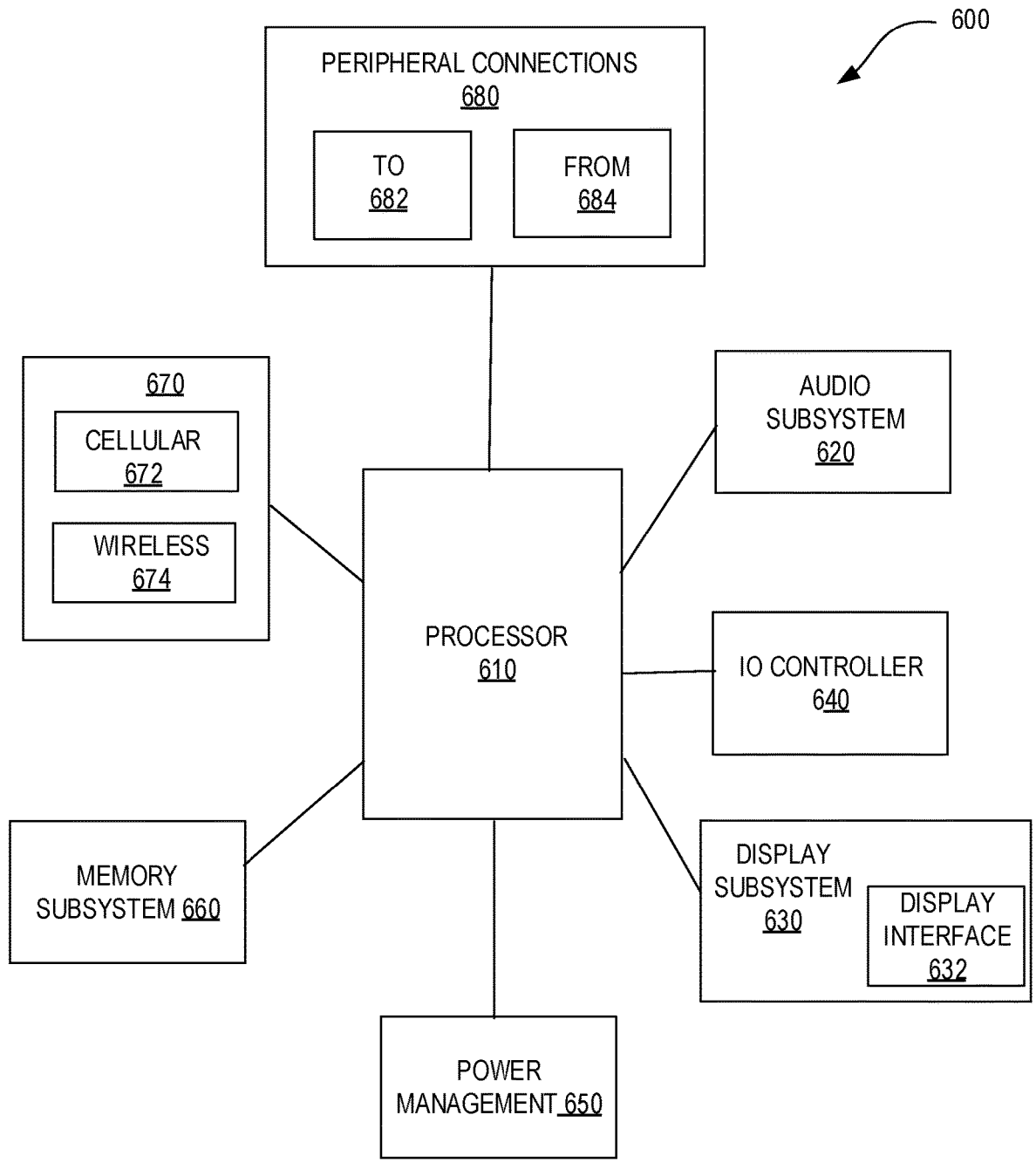
FIG. 6 illustrates a package having a massively parallel high-density bond pad array, fabricated according to the disclosed method, as part of a system-on-chip (SoC) package in an implementation of computing device, according to some embodiments of the disclosure.

FIG. 6 illustrates a package having a high-density bond pad array, fabricated according to the disclosed method, as part of a system-on-chip (SoC) package in an implementation of computing device, according to some embodiments of the disclosure.

FIG. 6 illustrates a block diagram of an embodiment of a mobile device in which flat surface interface connectors could be used. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632 which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Network interface 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is a micronozzle assembly, comprising a reservoir, an array of structures comprising micronozzles, and a porous structure positioned between the reservoir and the array, and an electrode within the reservoir, wherein the electrode comprises any of a mesh, a frame along the perimeter of the cavity of the reservoir, or a rod extending into a cavity of the reservoir.

Example 2 includes all of the features of example 1, wherein the micronozzle array is integrated on a first side of the porous structure, and wherein the reservoir is integrated on a second side opposite of the first side of the porous structure.

Example 3 includes all of the features of example 2, wherein the reservoir comprises a cavity over the porous structure.

Example 4 includes all of the features of examples 2 or 3, wherein the porous structure is a fluid distribution plate.

Example 5 includes all of the features of any one of examples 2 through 4, wherein the porous structure comprises a ceramic material.

Example 6 includes all of the features of any one of examples 1 through 5, wherein the porous structure comprises an organic material.

Example 7 includes all of the features of any one of examples 2 through 6, wherein the porous structure comprises straight pores coupled to the cavity of the reservoir and to the micronozzle array.

Example 8 includes all of the features of any one of examples 2 through 7, wherein the porous structure comprises tortuous pores coupled to the cavity of the reservoir and to the micronozzle array.

Example 9 includes all of the features of any one of examples 1 through 8, wherein the micronozzle array has an array pitch is 100 microns or less.

Example 10 includes all of the features of any one of examples 1 through 9, wherein the micronozzle array comprises at least 10,000 micronozzles having a center-to-center pitch of 100 microns or less.

Example 11 includes all of the features of any one of examples 1 through 9, wherein the micronozzle array comprises at least 100,000 micronozzles having a center-to-center pitch of 100 microns or less.

Example 12 includes all of the features of any one of examples 1 through 9, wherein the micronozzle array comprises at least 1,500,000 micronozzles having a center-to-center pitch of 100 microns or less.

Example 13 includes all of the features of any one of examples 1 through 12, wherein the reservoir is coupled to a pump.

Example 14 includes all of the features of any one of examples 1 through 13, wherein the integrated assembly is coupled to a motion actuator.

Example 15 includes all of the features of any one of examples 1 through 14, wherein the at least one micronozzle comprises a conical tip.

Example 16 includes all of the features of any one of examples 1 through 15, wherein the at least one micronozzle comprises a cylindrical tip.

Example 17 includes all of the features of any one of examples 1 through 16, wherein the electrode comprises a mesh.

Example 18 includes all of the features of any one of examples 3 through 17, wherein the electrode comprises a frame along the perimeter of the cavity of the reservoir.

Example 19 includes all of the features of any one of examples 1 through 18, wherein the electrode comprises a rod extending into the cavity of the reservoir.

Example 20 includes all of the features of any one of examples 1 through 19, wherein the electrode comprises any one of gold, platinum, palladium, copper or nickel.

Example 21 is a micronozzle assembly comprising an integrated assembly, comprising a reservoir, a micronozzle array, wherein the micronozzle array comprises at least one micronozzle and an electrode within the reservoir.

Example 22 includes all of the features of example 21, wherein the electrode is coupled to an electrical power source.

Example 23 includes all of the features of examples 21 or 22, further comprising a motion actuator comprising a stage, wherein the motion actuator comprises a mechanism that displaces the stage in at least a first dimension and a second dimension.

Example 24 includes all of the features of example 23, wherein a substrate is on the stage of the motion actuator.

Example 25 includes all of the features of any one of examples 21 through 24, wherein the motion actuator is a first motion actuator, and wherein the integrated assembly is coupled to a second motion actuator that comprises a mechanism that displaces the second substrate in a third dimension, wherein the third dimension is substantially orthogonal to the first dimension and to the second dimension.

Example 26 includes all of the features of any one of examples 21 through 25, wherein the integrated assembly is fastened to a chamber head.

Example 27 includes all of the features of any one of examples 21 through 26, wherein the reservoir is coupled to a vessel.

Example 28 includes all of the features of example 26, wherein an electrolyte is within the vessel.

Example 29 includes all of the features of example 27, wherein the electrolyte is pressurized.

Example 30 includes all of the features of any one of examples 21 through 29, wherein the micronozzle array comprises at least 10,000 micronozzles having a center-to-center pitch of 100 microns or less.

Example 31 includes all of the features of any one of examples 21 through 29, wherein the micronozzle array comprises at least 100,000 micronozzles having a center-to-center pitch of 100 microns or less.

Example 32 includes all of the features of any one of examples 21 through 29, wherein the micronozzle array comprises at least 1,000,000 micronozzles having a center-to-center pitch of 100 microns or less.

Example 33 is a system comprising a micronozzle assembly, comprising a reservoir coupled to a fluid path, an array of structures comprising between 10,000 and 1,500,000 micronozzles having a center-to-center pitch of 100 microns or less, a porous structure positioned between the reservoir and the array, an electrode within the reservoir, wherein the electrode comprises any of a mesh, a frame along the perimeter of the cavity of the reservoir, or a rod extending into a cavity of the reservoir; and a power source coupled to the electrode.

Example 34 includes all of the features of example 33, wherein the fluid path includes an interface to couple the fluid path to a vessel for containing electrolyte.

Example 35 includes all of the features of examples 33 or 34, wherein the fluid path includes an interface couple the fluid path to a pressure source.

Example 36 includes all of the features of examples 33 through 35, further comprising an interface to couple the micronozzle assembly to a motion actuator.

Example 37 includes all of the features of examples 33 through 36, further comprising a substrate mount, wherein the substrate mount includes an interface to couple the substrate mount to a motion actuator.

Example 38 is a probe assembly, comprising a substrate having a conductive surface; and an array comprising probe wires extending from the conductive surface, wherein the probe wires are electroplated structures that are contiguous with the conductive surface, and wherein the probe wires are substantially straight and extend from the conductive surface at an acute angle with respect to a plane of the conductive surface, the probe wires have a chevron shape, wherein the probe wires comprise a first segment extending from the conductive surface at a first angle with respect to the plane of the conductive surface, the first segment having an end, and a second segment extending from the end of the first segment at a second angle with respect to the first angle; or the probe wires have a spiral shape.

Example 39 includes all of the features of example 38, wherein the probe wires have an aspect ratio of at least 10:1, and wherein the probe wires comprise one of: gold, copper or nickel.

Example 40 includes all of the features of examples 38 or 39, wherein the conductive surface comprises one of gold, copper or nickel.

Example 41 is a method comprising forming a substrate comprising a conductive surface, wherein the conductive surface is coupled to an electrical power source, coupling a micronozzle array to a fluid path, wherein the micronozzle array comprises one or more micronozzles, and wherein an electrode is included within the fluid path, coupling the electrode to the electric power source, positioning the substrate below the micronozzle array; and electroplating an array of metal structures over the conductive surface of the substrate, wherein the array of metal structures comprises at least one microstructure, wherein the array of metal structures comprises one or more three-dimensional metal structures, wherein the one or more three-dimensional metal structures includes an array pitch that is substantially the same as the center-to-center pitch of the micronozzle array.

Example 42 includes all of the features of example 41, wherein the fluid path comprises electrolyte flowing through a fluid reservoir.

Example 43 includes all of the features of example 41, further comprising mounting the substrate on a motion actuator stage, wherein the motion actuator stage moves the substrate in at least two directions.

Example 44 includes all of the features of example 43, wherein the motion actuator stage moves the substrate in the z-direction.

Example 45 includes all of the features of any one of examples 41 through 44, wherein positioning the substrate below the micronozzle array comprises adjusting the distance between the micronozzle array and the substrate.

Example 46 includes all of the features of any one of examples 41 through 45, wherein plating an array of metal structures comprises forming a meniscus between the at least one micronozzle and the at least one microstructure.

Example 47 includes all of the features of example 46, wherein forming the meniscus between the at least one micronozzle and the at least one microstructure comprises flowing the electrolyte the at least one micronozzle at a precise flow rate.

Example 48 includes all of the features of any one of examples 45 through 47, wherein adjusting the distance between the micronozzle array and the substrate comprises mounting the substrate on the motion actuator stage and displacing the substrate in the z-direction relative to the micronozzle array.

Example 49 includes all of the features of example 48, wherein displacing the substrate in the z-direction comprises displacing the substrate in the z-direction relative to the micronozzle array comprises displacing the substrate in the z-direction at substantially the same rate as the rate of growth of the metal microstructures.

Example 50 includes all of the features of any one of examples 41 through 49, wherein plating the array of metal structures over the conductive surface of the substrate comprises move the substrate laterally to form inclined metal microstructures.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A microelectrodeposition assembly for parallel direct writing of a two-dimensional (2D) array of discrete metal microstructures, the assembly comprising:
   an electrolyte reservoir comprising a cavity surrounded by a wall, wherein a bottom of the electrolyte reservoir comprises a porous structure;
   a 2D array of structures comprising micronozzles in fluid communication with the electrolyte reservoir through the porous structure, wherein the 2D array of structures comprises at least 10,000 micronozzles having a center-to-center pitch substantially equal to a center-to-center pitch of individual ones of the 2D array of discrete metal microstructures to be deposited in parallel by corresponding individual ones of the micronozzles; and
   an electrode within the electrolyte reservoir, wherein the electrode is separated from the 2D array of structures by the porous structure and wherein the electrode comprises any of a mesh, a frame along a perimeter of the cavity of the electrolyte reservoir, or a rod extending into the cavity of the electrolyte reservoir.

2. The assembly of claim 1, wherein the 2D array of structures comprising micronozzles is integral with the porous structure, and wherein the wall of the electrolyte reservoir is integral with the porous structure.

3. The assembly of claim 1, wherein the porous structure comprises tortuous pores.

4. The assembly of claim 1, wherein the porous structure comprises straight pores in an ordered array.

5. The assembly of claim 1, wherein the porous structure comprises a ceramic material or an organic material, and wherein the micronozzles comprise an epoxy resin.

6. The assembly of claim 1, wherein the 2D array of structures comprises between 10,000 micronozzles and 1,500,00 micronozzles, the center-to-center pitch is 100 microns or less, and each of the micronozzles comprises an orifice of a diameter substantially equal to, or greater than, a diameter of individual ones of the metal microstructures.

7. The assembly of claim 1, wherein the porous structure comprises a plurality of orifices within an area overlapping an area of each of the micronozzles.

8. A microelectrodeposition system for parallel direct writing of a two-dimensional (2D) array of discrete metal microstructures, the system, comprising:

a micronozzle assembly, comprising:
  an electrolyte reservoir coupled to a fluid path, wherein the electrolyte reservoir comprises a cavity surrounded by a wall and a bottom of the electrolyte reservoir comprises a porous structure;
  a 2D array of structures comprising between 10,000 and 1,500,000 micronozzles in fluid communication with the electrolyte reservoir through the porous structure, the micronozzles having a center-to-center pitch of 100 microns or less and substantially equal to a center-to-center pitch of individual ones of the 2D array of discrete metal microstructures to be deposited in parallel by corresponding individual ones of the micronozzles;
  an electrode within the electrolyte reservoir, wherein the electrode is separated from the 2D array of structures by the porous structure and wherein the electrode comprises any of a mesh, a frame along a perimeter of the cavity of the electrolyte reservoir, or a rod extending into the cavity of the electrolyte reservoir;
a power source coupled to the electrode; and
a motion actuator to displace the micronozzle assembly vertically relative to the 2D array of microstructures during the direct writing.

9. The system of claim 8, wherein the fluid path includes an interface to couple the fluid path to a vessel for containing electrolyte.

10. The system of claim 8, wherein the fluid path includes an interface to couple the fluid path to a pressure source.

11. The system of claim 8, further comprising an interface to couple the micronozzle assembly to the motion actuator.

12. The system of claim 8, further comprising a substrate mount, wherein the substrate mount includes an interface to couple the substrate mount to the motion actuator.

13. The system of claim 8, wherein the porous structure comprises tortuous pores.

14. The system of claim 8, wherein the porous structure comprises straight pores in an ordered array.

15. The system of claim 8, wherein the porous structure comprises a ceramic material or an organic material, and wherein the micronozzles comprise an epoxy resin.

16. The system of claim 15, wherein the porous structure comprises the organic material and the organic material is one of cellulose acetate, mixed cellulose ester, polycarbonate, polyether ether ketone (PEEK), polyethersulfone (PES), polyester, polypropylene, polytetrafluoroethylene (PTFE), or polyvinylidene difluoride (PVDF).

17. The system of claim 8, wherein each of the micronozzles comprises a conical interior cavity.

18. The system of claim 8, wherein the center-to-center pitch of the micronozzles is 30 microns, or less.

* * * * *